United States Patent
Shimawaki

Patent Number: 5,296,389
Date of Patent: Mar. 22, 1994

[54] METHOD OF FABRICATING A HETEROJUNCTION BIPOLAR TRANSISTOR

[75] Inventor: Hidenori Shimawaki, Tokyo, Japan

[73] Assignee: NEC Corporation, Japan

[21] Appl. No.: 817,860

[22] Filed: Jan. 6, 1992

Related U.S. Application Data

[62] Division of Ser. No. 657,672, Feb. 19, 1991, Pat. No. 5,160,994.

[30] Foreign Application Priority Data

Feb. 19, 1990 [JP] Japan .................... 2-36099

[51] Int. Cl.$^5$ .......................... H01L 21/265
[52] U.S. Cl. ........................ 437/31; 437/133; 437/7; 148/DIG. 72
[58] Field of Search ............ 437/31, 126, 133, 7; 357/16, 34; 148/DIG. 72; 257/197, 198

[56] References Cited

U.S. PATENT DOCUMENTS

| | | | |
|---|---|---|---|
| 4,939,562 | 7/1990 | Adlerstein | 257/198 |
| 5,024,958 | 6/1991 | Awano | 437/31 |

FOREIGN PATENT DOCUMENTS

| | | | |
|---|---|---|---|
| 0022829 | 1/1990 | Japan | 357/34 |

*Primary Examiner*—Brian E. Hearn
*Assistant Examiner*—Tuan Nguyen
*Attorney, Agent, or Firm*—Laff, Whitesel, Conte & Saret

[57] ABSTRACT

On a semi-insulating substrate, an emitter layer (or a collector layer), a base layer, a compound semiconductor layer containing In and a collector layer (or an emitter layer) are provided. The collector layer (or the emitter layer) is patterned to form a collector region (or an emitter region). When the base surface is revealed by a reactive ion beam etching, the etching will be stopped at the compound semiconductor layer that contains In. Consequently, the nonuniformity in the base resistance that depends on the thickness of the base lead-out region can be reduced.

11 Claims, 9 Drawing Sheets

METHOD OF FABRICATING A HETEROJUNCTION BIPOLAR TRANSISTOR

This application is a division of prior application Ser. No. 07/657,672, filed Feb. 19, 1991, now U.S. Pat. No. 5,160,994.

BACKGROUND OF THE INVENTION

The present invention relates to heterojunction bipolar transistors and fabrication methods thereof.

The bipolar transistors have an excellent feature that their current drive performance is superior to that of the field effect transistors. Because of it, research and development of the bipolar transistors using not only silicon but also compound semiconductors such as gallium arsenide is actively engaged in recent years. In particular, the heterojunction bipolar transistors that use compound semiconductors (referred to as HBTs hereinafter) have such an advantage as enabling to hold the emitter injection efficiency at a high level even when the base is doped to a high concentration by making the gap of the forbidden band of the emitter to the greater than that of the base.

Next, an example of the collector-up type HBT will be described following the steps of its fabrication.

First, an n-$Al_{0.25}Ga_{0.75}As$ layer (emitter layer), a p-GaAs layer (base layer) and a n-GaAs layer (collector layer) are sequentially formed by a molecular beam epitaxy method- (referred to as MBE method hereinafter) on a semi-insulating substrate consisting of GaAs. Next, after forming a collector electrode of a predetermined pattern having a silicon oxide film on its surface, and a collector region is formed by etching the n-GaAs layer using the collector electrode as a mask. Subsequently to the above process, a base electrode is formed according to a predetermined pattern on the exposed p-GaAs layer. Next, the p-GaAs layer outside the base electrode and the surface part of the underlying n-$Al_{0.25}Ga_{0.75}As$ layer are removed, and an emitter electrode is formed on the exposed n-$Al_{0.25}Ga_{0.75}As$ layer.

The thickness of the p-GaAs layer on which is formed the base electrode is determined by an etching process (the base surface revealing process) that forms the collector layer. In the base surface revealing process, a part of the surface of the p-GaAs layer is exposed by etching the overlying n-GaAs layer, but the contact resistance between the base layer and the base electrode becomes high if the etching of the n-GaAs layer is insufficient. Such an increase in the contact resistance can be avoided by etching the surface part of the p-GaAs layer. Since, however, the thickness of the p-GaAs layer underlying the base electrode (the base lead-out region) becomes smaller than that of the active base layer (the part in contact with the collector layer) as a result of such an operation, the base resistance will have to be increased. In practice, the thickness of the base lead-out region has to be made slightly smaller than that of the active base layer in order to avoid the increase in the contact resistance.

Consequently, the adequacy of the above-mentioned process strongly influences the high speed and the high frequency characteristics of the resulting transistor. In addition, the thickness of the base layer has a very small value of 70 to 100 nm so that the nonuniformity in the etching amount within the wafer becomes one of the causes of drastically reducing the uniformity of the characteristics of the elements. Heretofore, it has been very difficult to carry out the above-mentioned process for the entirely of the wafer under a sufficiently satisfactory controllability, and it has been inevitable to have a nonuniformity on the order of 20 nm for 2-inch wafers.

In the case of the emitter-up type HBTs, the base surface revealing process means to etch the AlGaAs layer. In this connection there is a report that it is possible to selectively remove the AlGaAs layer by a wet etching. Namely, according to P. M. Asbeck et al., "GaAlAs/GaAs Heterojunction Bipolar Transistors: Issues and Prospects for Application," IEEE Transactions on Electron Devices, Vol. 36, No. 10, p. 2032, October 1989, it is possible to carry out the surface revealing with a standard deviation of 3 to 4 nm for 2-inch wafers. However, the inventors were unable to confirm this with sufficient reliable reproducibility. In other words, the selective removal of the AlGaAs layer cannot be said to be a sufficiently matured technology. Moreover, from the sense of simplifying the fabrication process, the simultaneous use of a wet etching is not desirable. So far as the dry etching methods are concerned, there is not known a means for selectively removing the AlGaAs layer with respect to the GaAs layer, so that there exist the same problems as for the collector-up type HBTs.

BRIEF SUMMARY OF THE INVENTION

It is therefore the object of the present invention to provide bipolar transistors, and the methods of manufacturing thereof, which have smaller nonuniformity of the base resistance.

The HBT in accordance with the present invention has a compound semiconductor layer containing In, preferably $In_xGa_{1-x}As$, ($0<x<1$), between the emitter layer (or the collector layer) and the base layer. Here, all of the emitter layer, the base layer and the collector layer are formed of semiconductors that do not contain In. Since the vapor pressures of the chlorides and the fluorides of In are low, it is possible to stop the etching with satisfactory controllability at the surface of a compound semiconductor layer containing In by carrying out a dry etching containing chlorine or fluorine. Accordingly, the controllability of the surface revealing process forming a mesa-shaped emitter region (or collector region) can be made excellent. In other words, the variability of the thickness of the base lead-out region becomes small, and the nonuniformity of the base resistance can be reduced.

BRIEF DESCRIPTION OF THE DRAWINGS

The above-mentioned objects, features and advantages of this invention will become more apparent by reference to the following detailed description of the invention taken in conjunction with the accompanying drawings, wherein.

DETAILED DESCRIPTION OF THE PREFERRED EMBODIMENTS

A collector-up type HBT according to the first embodiment of the present invention and a method of fabrication thereof will be described in the following.

Figure 1A:
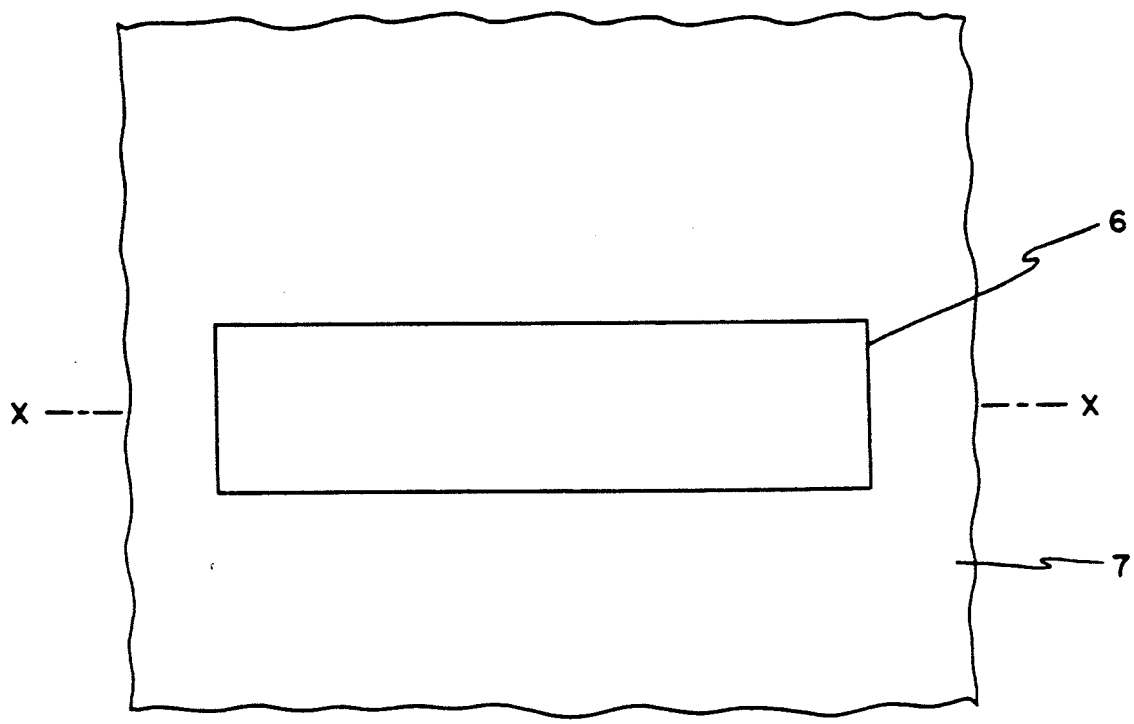
FIG. 1 to FIG. 7 show semiconductor chips for the major processes in the fabrication of the collector-up type HBT in accordance with a first embodiment of the present invention, where each part (a) shows a schematic plan view and the part (b) shows a schematic sectional view along the line X—X in part (a)
Figure 1B:
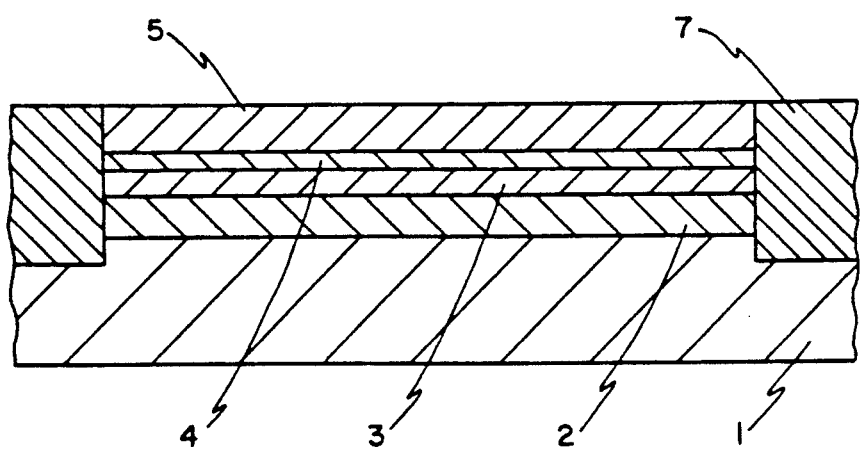

First, as shown in FIGS. 1(a) and 1(b), on a semi-insulating substrate 1 consisting of GaAs, an n-Al$_{0.25}$Ga$_{0.75}$As layer 2 (emitter layer) with thickness of 500 nm and inpurity concentration of $1 \times 10^{17}$ cm$^{-3}$, a p-GaAs layer 3 (base layer) with thickness of 80 nm and impurity concentration of $2 \times 10^{19}$ cm$^{-3}$, a p-In$_{0.3}$Ga$_{0.7}$As layer 4 with thickness of 5 nm and impurity concentration of $2 \times 10^{19}$ cm$^{-1}$ and an n-GaAs layer 5 (collector layer) with thickness of 500 nm and impurity thickness of $1 \times 10^{17}$ cm$^{-3}$ are sequentially deposited by an MBE method at a formation temperature of 550° C. Next, an insulating region 7 is formed by injecting protons into the portion excluding a rectangular region 6 for forming an HBT.

Figure 2A:
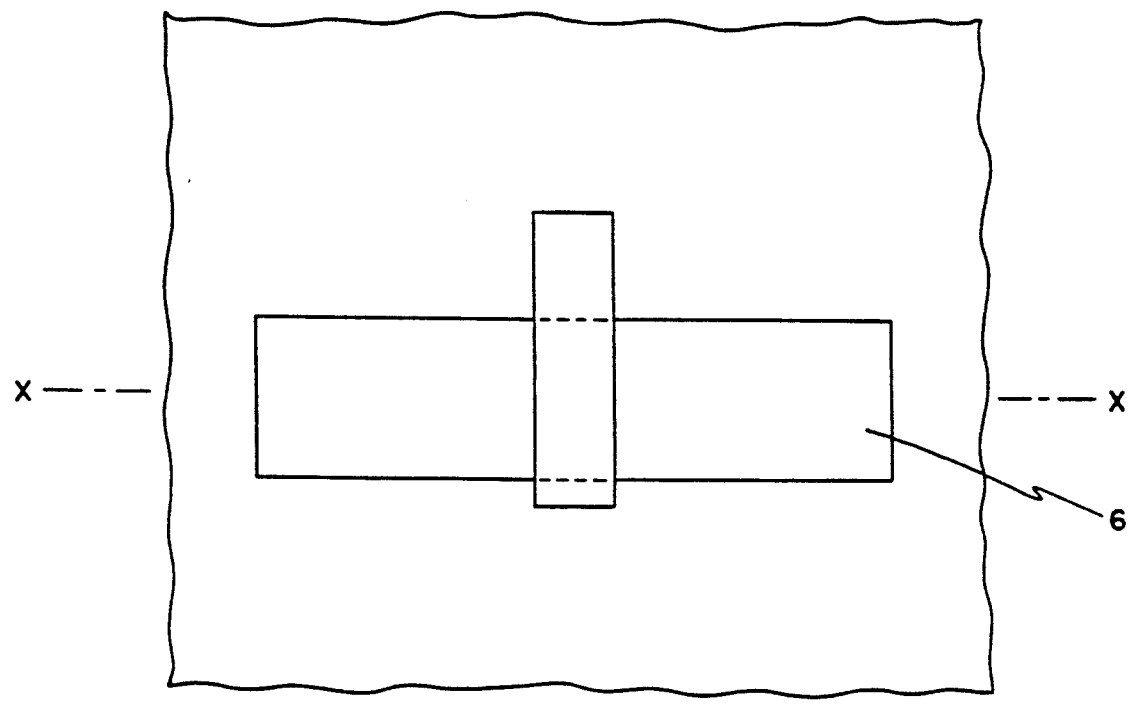
Figure 2B:
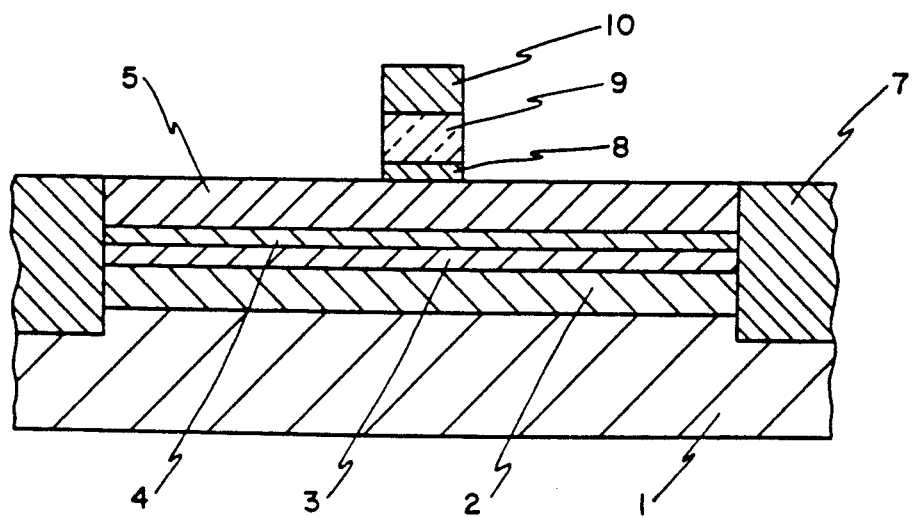

Then, as shown in FIGS. 2(a) and 2(b), an Au-Ge-Ni layer 8 is formed by a vapor deposition method, a 500 nm-thick silicon oxide film 9 is deposited and a rectangular photoresist film 10 that traverses over the rectangular region 6 is formed. The silicon oxide film 9 is patterned by a reactive ion beam etching method using the photoresist film 10 as a mask, and the Au-Ge-Ni layer 8 is patterned by an ion milling method.

Figure 3A:
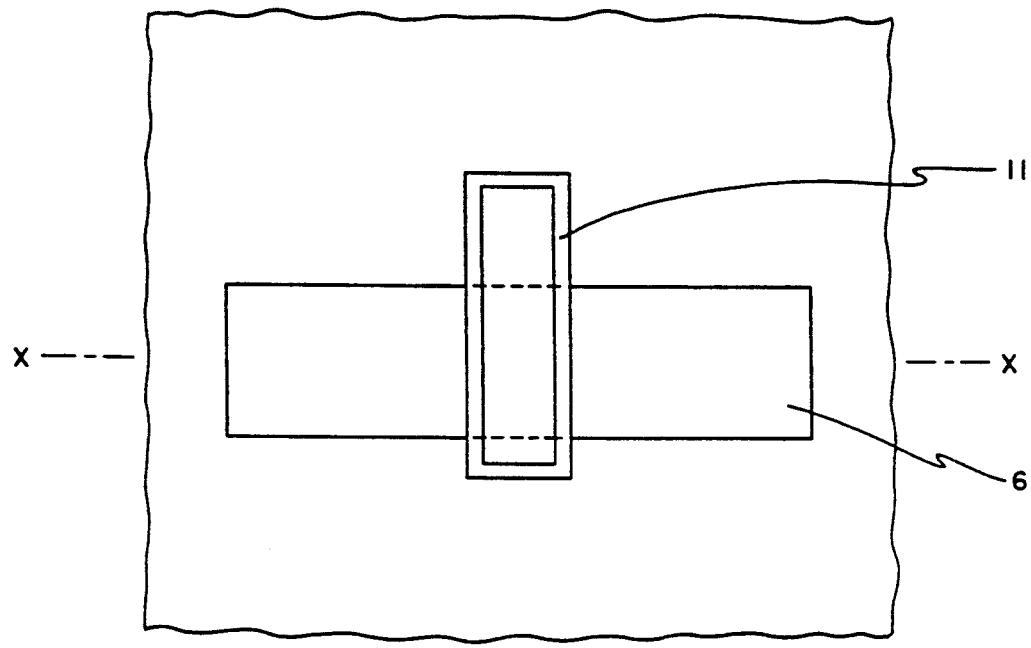
Figure 3B:
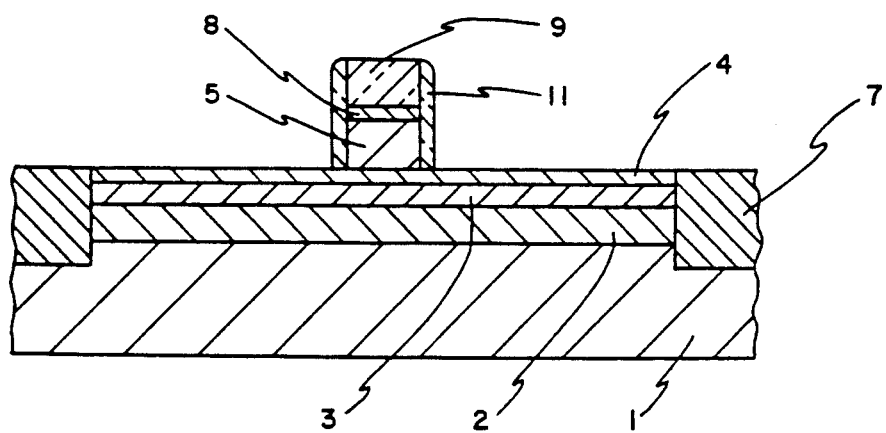

Next, as shown in FIGS. 3(a) and 3(b), after removal of the photoresist film 10 by washing with an organic solvent, the n-GaAs layer 5 is removed by a reactive ion beam etching method with the silicon oxide film 9 as a mask to expose the surface of the p-In$_{0.3}$Ga$_{0.7}$As layer 4. A collector region is formed in this manner. As an etching gas use may be made of a mixed gas of CCl$_2$F$_2$ and He, but it is desirable from the viewpoint of environmental protection to use Cl$_2$. The conditions of the etching which is carried out by the use of an electron cyclotron resonance (ECR) apparatus with the introduction of Cl$_2$ gas following the evacuation of the etching chamber to below $1 \times 10^{-6}$ Torr, are as in the following:

| | |
|---|---|
| Cl$_2$ flow rate: | 35 sccm, |
| Gas pressure: | $7 \times 10^{-4}$ Torr, |
| Forward power of input microwave: | 300 W, |
| Magnet current: | 10.2 A, |
| RF bias power on substrate: | 0 W, |
| Substrate holder temperature: | 40 to 60° C. |

Under these conditions the GaAs layer and AlGaAs layer are etched at a rate of about 200 nm/min, but the p-In$_{0.3}$Ga$_{0.7}$As layer is hardly etched.

Figure 4A:
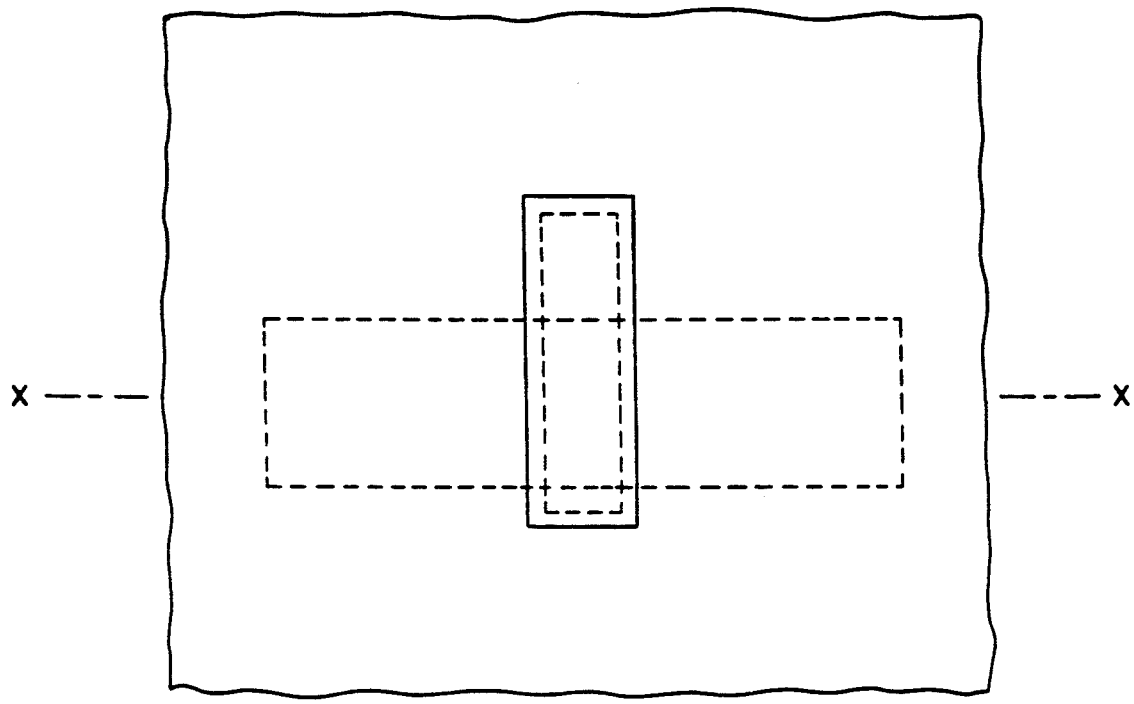
Figure 4B:
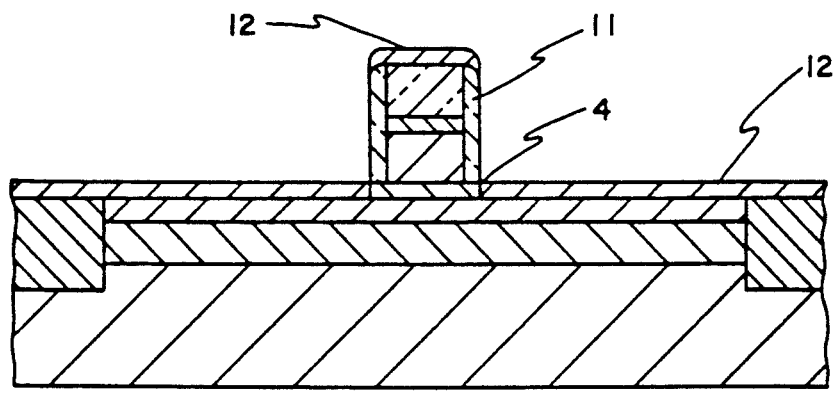

Subsequent to the above, a 200 nm-thick silicon oxide film is formed all over the surface by a CVD method, and an insulating sidewalls are formed on the side faces of a rectangular parallelepiped consisting of the n-GaAs layer 5, the Au-Ge-Ni layer 8 and the silicon oxide film 9 by an anisotropic reactive ion etching. Next, as shown in FIGS. 4(a) and 4(b), a slight wet etching is carried out in order to remove the surface damage on the p-In$_{0.3}$Ga$_{0.7}$As layer 4. Since the p-In$_{0.3}$Ga$_{0.7}$As layer 4 has a very small thickness of 5 nm, no harm will be done even if the layer 4 is removed in its entirety except for the portion directly beneath the rectangular parallelepiped surrounded by the insulating sidewalls 11.

As an etchant a mixed solution of H$_3$PO$_4$, H$_2$O$_2$ and H$_2$O in the ratios of 4:1:155 is used. In the case of the conventional collector-up type HBT, there does not exist a p-In$_{0.3}$Ga$_{0.7}$As layer but the insulating sidewalls are formed by reactive ion beam etching, so that it is usual to remove the surface damages by a wet etching. Therefore, this not a process which needs be especially added. Subsequently to the above, an Au-Ge-Ni layer 12 is formed by a vacuum evaporation method. Since the vacuum evaporation is applied from above, the Au-Zn-Ni layer 12 will not be adhered on the side faces of the insulating sidewalls 11.

Figure 5A:
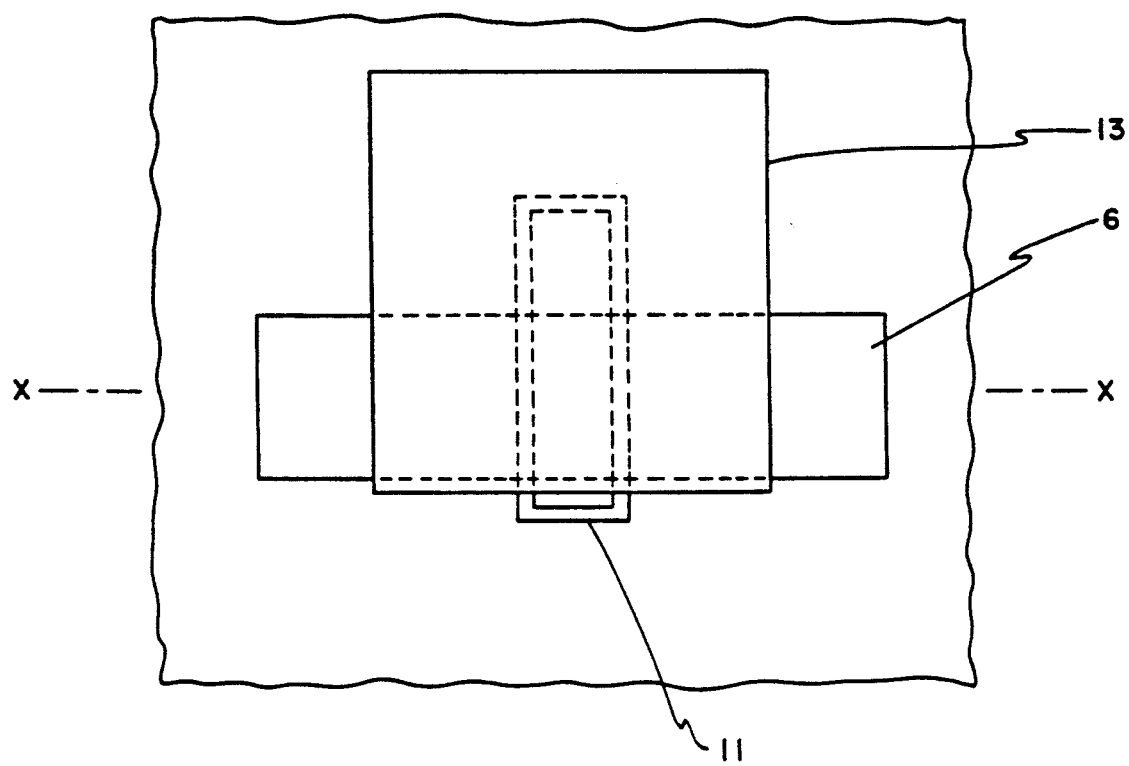
Figure 5B:
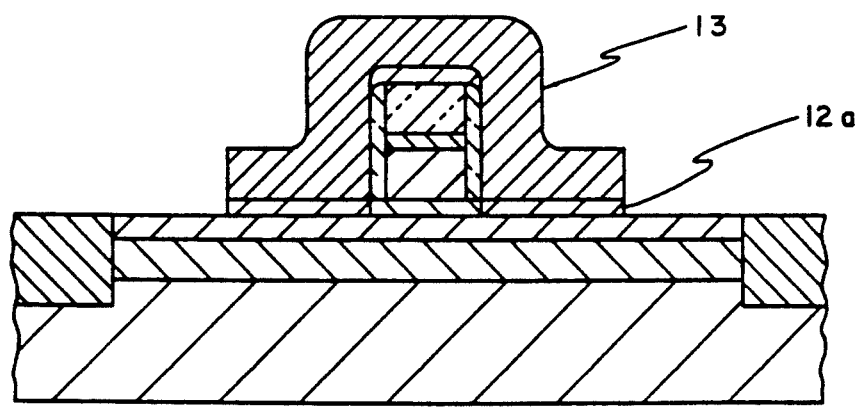

Next, as shown in FIGS. 5(a) and 5(b), the rectangular region 6 except for its both end parts and practically the entire portion that is surrounded by the insulating sidewalls 11 are covered with a photoresist film 13. Then, a base electrode 12a is formed by etching the Au-Ge-Ni layer by an ion milling method using the photoresist film 13 as a mask.

Figure 6A:
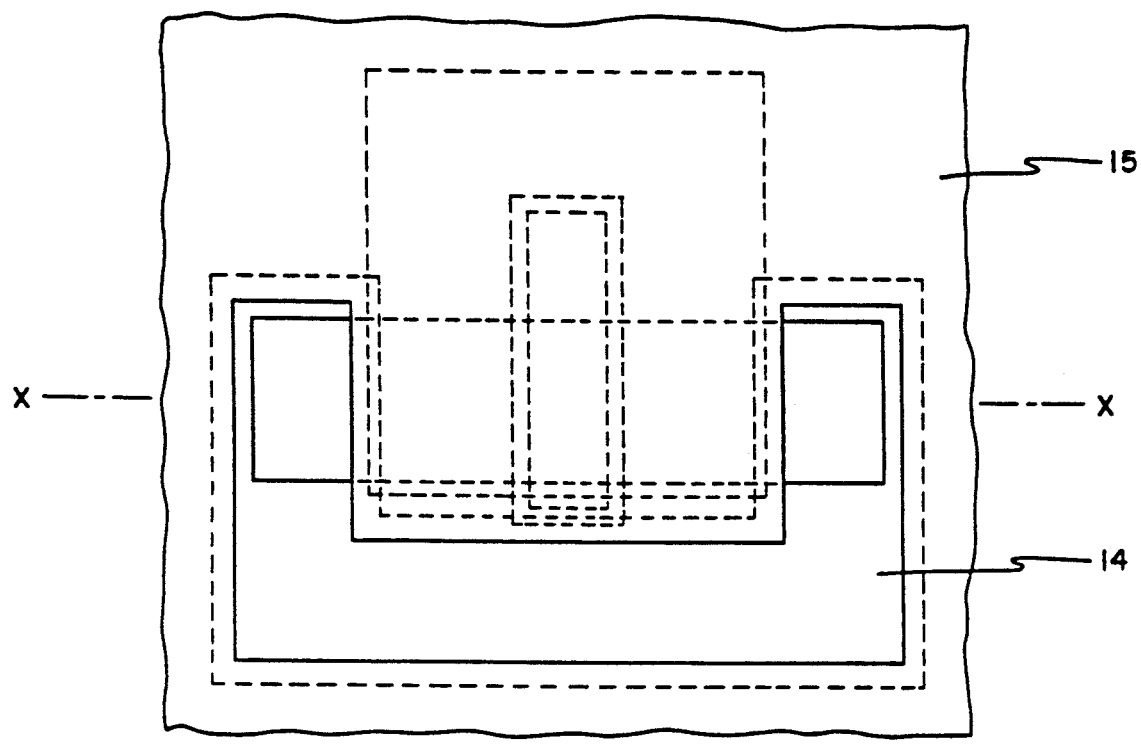
Figure 6B:
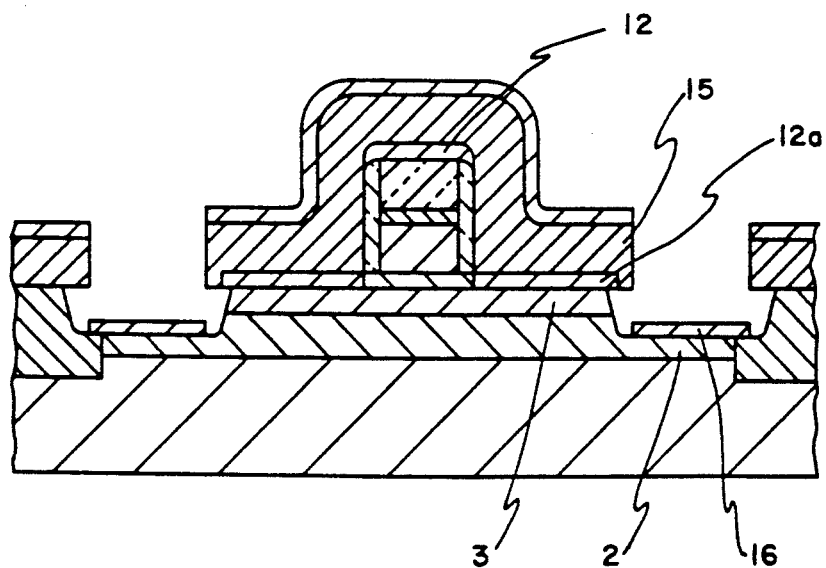

Next, after dissolving the photoresist film 13 in an organic solvent, a photoresist film 15 with U-shaped openings 14 is formed, and the surface parts of the p-GaAs layer 3 and the n-Al$_{0.25}$Ga$_{0.75}$As layer 2 are removed using a mixed solution of H$_3$PO$_4$, H$_2$O$_2$ and H$_2$O in the ratios of 4:1:90, as shown in FIGS. 6(a) and 6(b). Then, an Au-Ge-Ni layer is formed by vacuum evaporation from above by using the photoresist film 15 as a mask, and the emitter electrodes 16 are formed by carrying out lift-off. Further, after forming allover the surface a photoresist film with flat surface (not shown), the photoresist film is etched by a reactive ion beam etching, and the Au-Ge-Ni layer 12 above the collector layer is removed by an ion milling method.

Figure 7A:
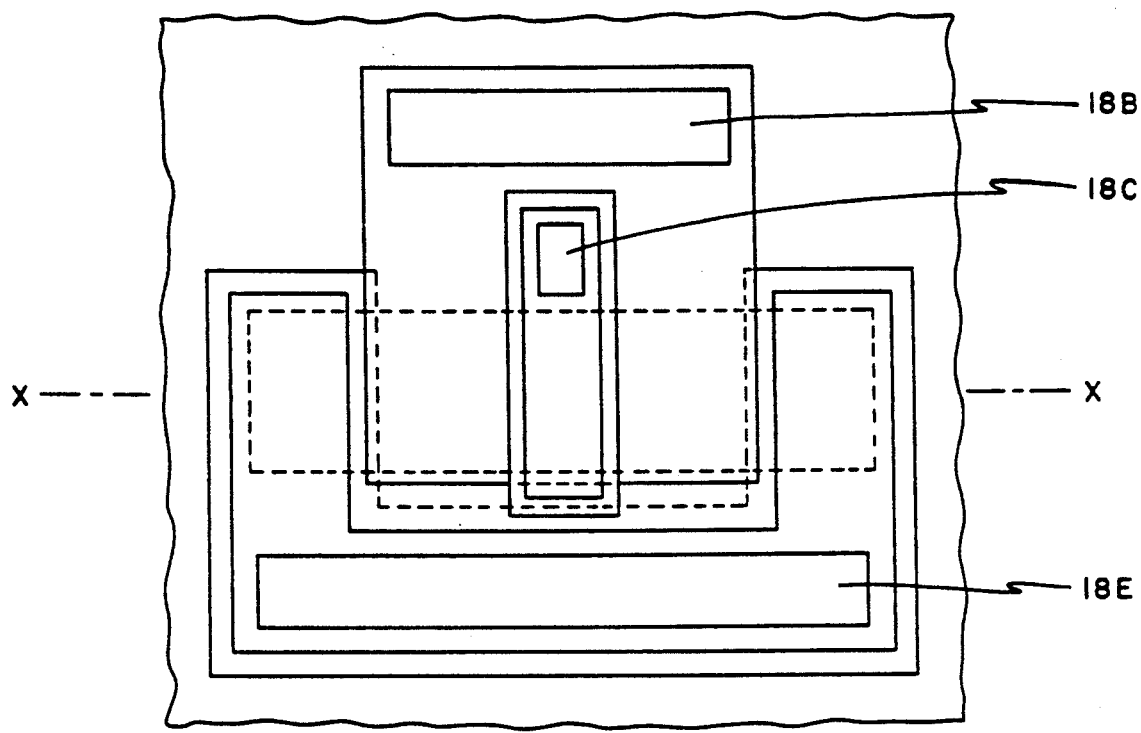
Figure 7B:
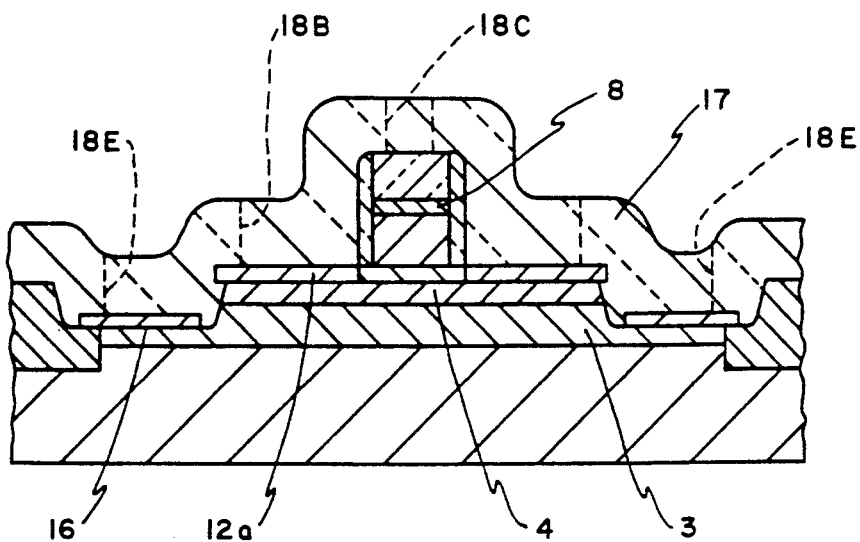

Next, after removing the above-mentioned photoresist film, a 500 nm-thick silicon oxide film 17 is formed allover the surface, as shown in FIGS. 7(a) and 7(b). In FIG. 7(a), those parts that are covered exclusively with the silicon oxide film 17 are depicted with solid lines. Subsequently to the above, contact holes 18B, 18C and 18C are provided at predetermined locations of the silicon oxide film 17. Pads, not shown, that are connected to the base electrode 12a, the collector electrode 8 and the emitter electrode 16 via the contact holes 18B, 18C and 18C, respectively, are formed on the silicon oxide film 17. It is generally known possible to selectively etch Al$_x$Ga$_{1-x}$As ($0 \leq x \leq 1$) with respect to In$_y$Ga$_{1-y}$As ($0 < y < 1$) by the use of an etching gas such as Cl$_2$. This is considered due principally to the difference between the vapor pressures of the Al or Ga chloride and the In chloride (compared in terms of the boiling point, it is 183° C. for AlCl$_3$, 201° C. for GaCl$_3$ and 600° C. for InCl$_3$).

In accordance with the present invention, by providing a thin In$_y$Ga$_{1-y}$As layer at the junction part of the base and the collector part of the collector-up type HBT whose collector layer consists of GaAs, it is possible let the In$_y$Ga$_{1-y}$As film function as an etching stopper. With this arrangement, it is possible in the base surface revealing process mentioned above to selectively etch the GaAs layer that corresponds to the collector layer.

Thereafter, a wet etching is given in order to take out the surface damages. Since, however, it is not necessary to completely remove the In$_y$Ga$_{1-y}$As film, it is possible to confine the overetching of the base layer to about 5 nm at the most. It should be mentioned here that the contact resistance between the p-In$_y$Ga$_{1-y}$As layer and the Au-Ge-Ni layer is approximately equal to that between the p-GaAs layer and the Au-Ge-Ni layer. Therefore, it can be seen that the nonuniformity in the base resistance can be improved.

The thickness of the In$_y$Ga$_{1-y}$As layer needs be limited to such a value that will not introduce misfit dislocations due to this layer into the base and collector junction part, namely, to a value below the critical film thickness for GaAs. The critical film thickness varies with the In composition ratio y, but it is about 9 nm for y=0.3, for example, based on a report by J. M. Matthews et al., Journal of Crystal Growth, Vol. 27, 1974, p. 118.

Figure 8:
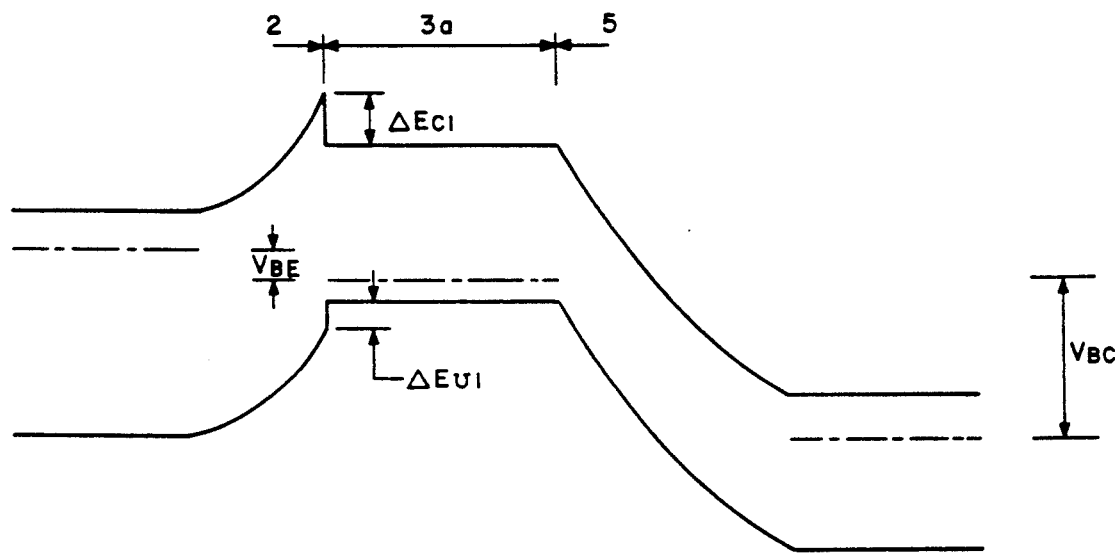
FIG. 8 is an every band diagram for a conventional HBT.
Figure 9:
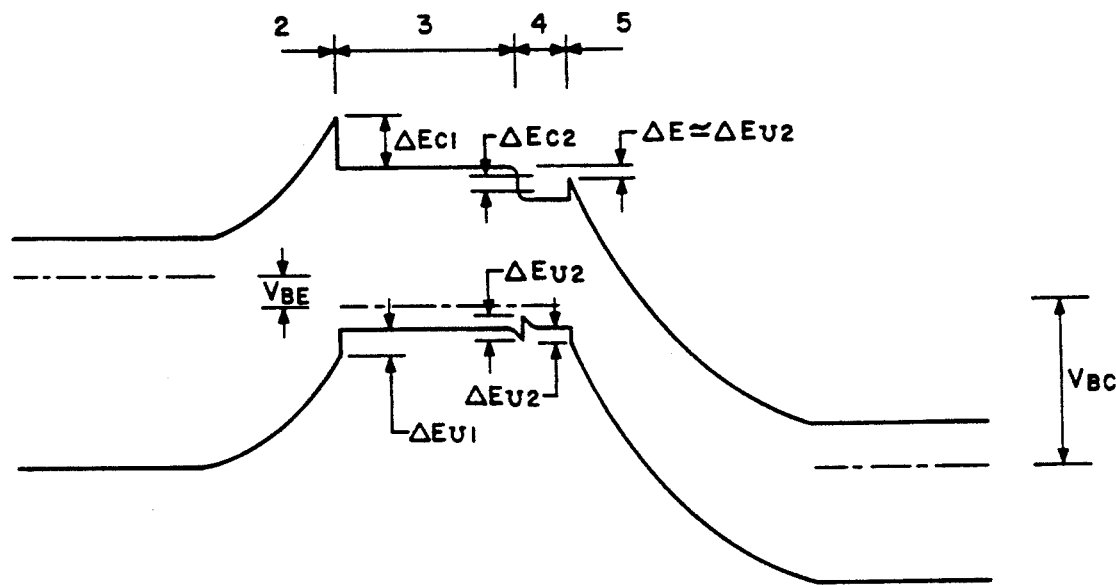
FIG. 9 is an energy band diagram for the collector-up type HBT which is the first embodiment of the present invention.

Next, the characteristics of the collector-up type HBT in accordance with the first embodiment of the present invention will be described. FIG. 9 is an energy band diagram when bias voltages $V_{BE}$ and $V_{BC}$ are applied to the first embodiment where the emitter and base junction is assumed for convenience to be a stepwise junction. When an electron which entered from the emitter (n-GaAs layer 2) to the p-GaAs layer 3 of the base goes into the p-In$_{0.3}$Ga$_{0.7}$As layer 4, it receives a kinetic energy that corresponds to the potential energy difference $\Delta E_{c2}$ (about 0.2 eV) at the base of the conduction band. The diffusion coefficient of the electron is greater in the p-In$_{0.3}$Ga$_{0.7}$As layer 4 than in the p-GaAs layer 3. Moreover, when an energy is added anew, it is apparent that the transit by the electron is faster than its traveling due to diffusion because of the generation of the speed overshoot effect of the electron. Therefore, if the thickness of the base layers are equal (that is, if the thickness of the base layer 3 in FIG. 8 is equal to the sum of the thicknesses of the p-GaAs layer 3 and the p-In$_{0.3}$Ga0.7As layer 4 in FIG. 9), then the time required for the electron to pass through the base layer is considered to be smaller than in the case of the conventional collector-up type HBT. However, the electron has to ride over the spike that exists at the base and collector junction part. The tip of the spike is lower than the base of the conduction band of the p-GaAs layer 3 by an amount $\Delta E$. If it is assumed that the energy difference between the base of the valence band and the Fermi level for the p-GaAs layer 3 and the p-In$_{0.3}$Ga$_{0.7}$As layer 4 are equal, then $\Delta E$ can be regarded to the approximately equal to $\Delta E_{v2}$. When the thickness of the that corresponds to the potential energy difference $\Delta E_{c2}$ $_{p-In0.3Ga0.7As}$ layer 4 is smaller than the mean free path of the electron, the electron can reach the collector by riding over the spike so that there will occur no problems. In the above $\Delta E_{v2}$ is the potential difference between the valence bands of the p-GaAs and the p-In$_{0.3}$Ga$_{0.7}$As which is about 0.1 eV. Accordingly, it can be said that there exists a possibility of reducing the base transit time and increasing the cut-off frequency of the HBT.

In the above the case of the conductivity type of the In$_y$Ga$_{1-y}$As film is p has been described.

It should be noted that an undoped In$_y$Ga$_{1-y}$As film can be used as an etching stopper. In that case the layer plays the role of a spacer layer in the base and collector junction part. Since the p-GaAs layer 3 is heavily doped and it is considered to be converted to a p-In$_y$Ga$_{1-y}$As layer in the stage when the system is completed as a transistor, the electrical properties of the resulting transistor may be said to be almost the same as in the embodiment described in the above.

Furthermore, an n-In$_y$Ga$_{1-y}$As layer may be used as an etching stopper. In that case, the layer plays a role as a part of the collector so that one only needs to remove it completely from the region where the base electrode is to be provided. Since this layer is thin, the change in the thickness of the base lead-out region due to the removal of this layer is small. The electrical properties other than the base resistance are considered to be approximately the same as for the conventional collector-up type HBT.

Next, the case of an emitter-up type HBT will be described as the second embodiment of the present invention.

In order to obtain this embodiment, one is only required to invert the vertical relation of the emitter layer and the collector layer in the collector-up type HBT described in the above, and insert an etching stopper beneath the emitter layer.

On a semi-insulating substrate 1, an n-GaAs layer 5, a p-GaAs layer 3, a p-In$_{0.3}$Ga$_{0.7}$As layer 4 and an n-Al$_{0.3}$Ga$_{0.7}$As layer 2 are sequentially deposited. The processes thereafter need be carried out in accordance with the case of the collector-up type HBT.

In forming an emitter region by patterning the n-Al$_{0.3}$Ga$_{0.7}$As layer 2 the underlying p-In$_{0.3}$Ga$_{0.7}$As layer 4 is used as an etching stopper. That an Al$_x$Ga$_{1-x}$As layer can be etched selectively with respect to an In Ga$_{1-y}$As layer is as described previously. Since the lattice constant of the Al$_x$Ga$_{1-x}$As hardly depends on the Al composition ratio x, the critical film thickness may be considered almost the same as in the case of the collector-up type HBT. Accordingly, in accordance with the present invention, the nonuniformity in the base resistance can also be reduced for the case of the emitter-top type HBT.

Figure 10:
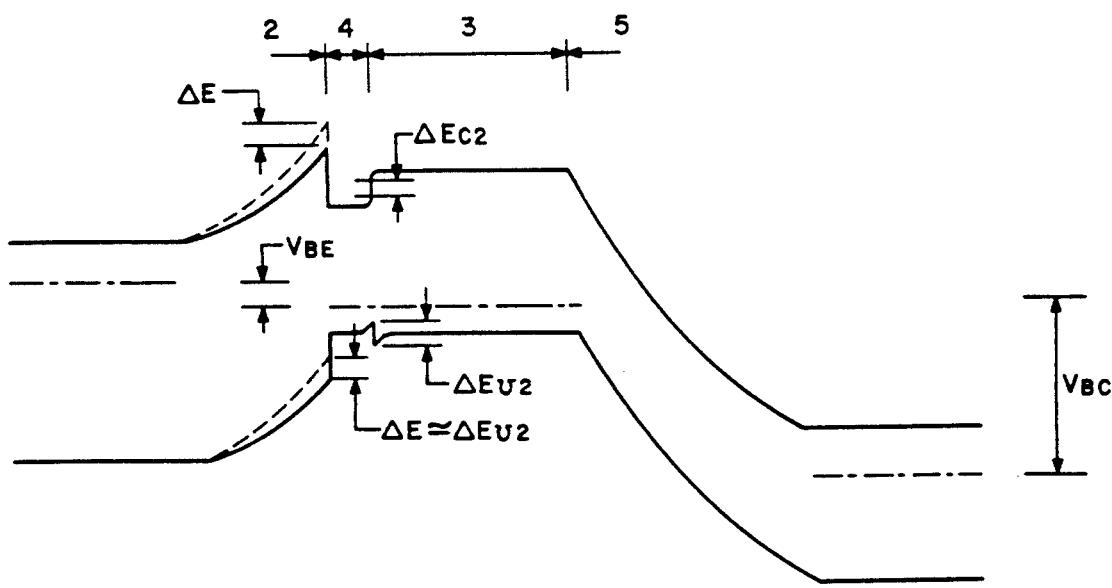
FIG. 10 is an energy band diagram for an emitter-up type HBT which is a second embodiment of the present invention.

FIG. 10 is an energy band diagram for the case when the present invention is applied to the emitter-up type HBT. The broken lines show the potential distributions when the p-In$_{0.3}$Ga$_{0.7}$As layer 4 is not inserted. The spike height as seen from the emitter becomes lower by about $\Delta E_{v2}$ (about 0.1 eV), and the base-emitter on-voltage is reduced by an amount corresponding to that quanity. Consequently, there can be obtained a characteristic which is particularly advantageous in connection with the application of this device to digital circuits or A-D converter circuits.

In the above description the case of the p-In$_y$Ga$_{1-y}$As layer has been taken up, but an undoped In$_y$Ga$_{1-y}$As layer may also be used as an etching stopper. In that case, the layer plays the role of a spacer in the emitter and base junction part, and the electrical properties of the transistor obtained are substantially the same as in the case where the p-In$_y$Ga$_{1-y}$As layer is employed.

Moreover, an n-In$_y$Ga$_{1-y}$As layer may be used as an etching stopper. In that case, the layer plays a role of being a part of the emitter so that it may be removed completely from the region that the base electrode is to be formed, and the change in the thickness of the base lead-out region is slight. Electrical characteristics other than the base resistance can be considered to be substantially the same as in the conventional emitter-up type HBT.

As an etching stopper, a compound semiconductor layer containing In, in addition to an In$_y$Ga$_{1-y}$As layer, may be used. In particular, Al$_x$In$_y$Ga$_{1-x-y}$As layers are preferable from the viewpoint of the lattice constant and the forbidden band gap.

Moreover, the present invention is not limited to HBTs of the abrupt junction structure, but can also be applied to HBTs of the graded junction structure. Furthermore, the present invention is not limited to the npn type HVTs, but may also be pnp type HBTs.

What is claimed is:

1. A method of fabricating a heterojunction bipolar transistor comprising the steps of:

depositing on a semi-insulating substrate an emitter layer made of a first semiconductor compound that is of a first conductivity type and is free of In;

depositing on said emitter layer a base layer made of a second semiconductor compound that is of a second conductivity type and is a semiconductor compound free of In, but is different from said first semiconductor compound;

depositing on said base layer a layer made of a third semiconductor compound that contains In;

depositing a collector layer made of a fourth semiconductor compound of said first conductivity type on said layer of said third semiconductor compound;

locally exposing said layer of said third semiconductor compound by patterning said collector layer in a prescribed shape by a use of a gas containing chlorine;

selectively removing said layer of said third semiconductor compound to expose a portion of said base layer; and forming a base electrode in contact with a part of said portion of said base layer.

2. A method of fabricating a heterojunction bipolar transistor as claimed in claim 1, wherein said gas containing chlorine is $Cl_2$.

3. A method of fabricating a heterojunction bipolar transistor as claimed in claim 1, wherein an $Al_xGa_{1-x}As$ layer, $(0<x<1)$, is deposited as one of said emitter layer, a GaAs layer is deposited as said base layer and said collector layer is patterned by dry etching that uses $Cl_2$ gas.

4. A method of fabricating a heterojunction bipolar transistor as claimed in claim 1, wherein said layer of compound semiconductor that contains In is $In_yGa_{1-y}As$ $(o<y<1)$.

5. The method as claimed in claim 1, further comprising the step of covering said prescribed shape of said collector layer with an insulating film, said step of selectively removing said layer of said third semiconductor compound being carried out by using said insulating film as a mask.

6. The method as claimed in claim 5, wherein said layer of said third semiconductor compound is doped with no impurity.

7. The method as claimed in claim 5, wherein said layer of said third semiconductor compound is said first conductivity type which is opposite to said second conductivity type of said base layer.

8. A method of fabricating a heterojunction bipolar transistor, said method comprising the steps of:

depositing on a semi-insulating substrate a collector layer made of a first semiconductor compound that is of a first conductivity type and is free of In;

depositing on said collector layer a base layer made of a second semiconductor compound that is of a second conductivity type and is free of In;

depositing on said base layer a layer made of a third semiconductor compound that contains In;

depositing on said layer of said third semiconductor compound an emitter layer made of a fourth semiconductor compound that is of said first conductivity type, but is a semiconductor compound which is different from said second semiconductor compound;

locally exposing said layer of said third semiconductor compound by patterning said emitter layer in a prescribed shape by the use of a gas containing chlorine;

selectively removing said layer of said third semiconductor compound to expose a portion of said base layer; and forming a base electrode in contact with a part of said portion of said base layer.

9. The method as claimed in claim 8, further comprising the step of covering said prescribed shape of said emitter layer with an insulating film, said step of selectively removing said layer of said third semiconductor compound being carried out by using said insulating film as a mask.

10. The method as claimed in claim 9, wherein said layer of said third semiconductor compound is doped with no impurity.

11. The method as claimed in claim 9, wherein said layer of said third semiconductor compound is said first conductivity type which is opposite to said second conductivity type of said base layer.

* * * * *